United States Patent
Yoshikawa et al.

[11] Patent Number: 5,815,036
[45] Date of Patent: Sep. 29, 1998

[54] APPARATUS AND METHOD FOR CONTROLLING FEEDFORWARD AMPLIFIER

[75] Inventors: Yoshishige Yoshikawa, Ibaraki; Hiroaki Kosugi, Hirakata; Hisashi Adachi, Minou; Kazuo Nagao, Yokohama, all of Japan

[73] Assignee: Matsushita Electric Industrial Co., Ltd., Osaka, Japan

[21] Appl. No.: 684,384

[22] Filed: Jul. 19, 1996

[30] Foreign Application Priority Data

Jul. 20, 1995 [JP] Japan .................................. 7-183680

[51] Int. Cl.⁶ ...................................................... H03F 3/66
[52] U.S. Cl. ............................................. 330/52; 330/151
[58] Field of Search ................................ 330/52, 149, 151

[56] References Cited

U.S. PATENT DOCUMENTS

| | | | |
|---|---|---|---|
| 4,617,522 | 10/1986 | Tarbutton et al. ................. | 330/149 |
| 5,323,119 | 6/1994 | Powell et al. ........................ | 330/151 |
| 5,485,120 | 1/1996 | Anvari ................................. | 330/151 |
| 5,489,875 | 2/1996 | Cavers ................................ | 330/151 |
| 5,508,657 | 4/1996 | Behan ................................. | 330/151 |

Primary Examiner—Steven Mottola
Attorney, Agent, or Firm—Ratner & Prestia

[57] ABSTRACT

A method and apparatus for controlling a feedforward amplifier, wherein a superior distortion compensation characteristic is maintained over a wide frequency range, with the influence due to temperature variation and weathering minimized. A pilot signal generated by a pilot signal generator circuit is injected into the output of the main amplifier of a feedforward amplifier, and then the signal is sampled at the output of a first circuit and a second circuit, which is then low-range converted by a frequency converter and demodulated into I and Q components by a quadrature demodulator, and amplified and shaped into a pilot monitor signal; and a control circuit controls the vector adjusters within the distortion suppression circuit of the first and the second circuits using the I and Q signal components as the error signal so that as the amplitude level of pilot monitor signal is mininized the control value is maintained.

15 Claims, 8 Drawing Sheets

APPARATUS AND METHOD FOR CONTROLLING FEEDFORWARD AMPLIFIER

FIELD OF THE INVENTION

The present invention relates to a control apparatus and a control method for maintaining the performance of a feedforward amplifier in best condition, said feedforward amplifier being a linear amplifier used mainly for amplifying multi-channel signals in high frequency bands, in which amplifier the non-linear distortion introduced by main amplifier is extracted and removed.

BACKGROUND

A feedforward amplifier is used in a transmitter of a base station of portable radio telephone systems, radio paging systems, etc.

In a portable radio telephone system, a base station transmits the signal through a plurality of channels, In a radio paging system, a base station also transmits the signal through a plurality of channels. For example, in a typical digital portable radio telephone system, a base station transmits the signal through 32 channels at a same time. In this case, separate amplification of each of the channels will not be acceptable, due to the excess cost and space required for a channel combiner necessary to combine the channels after amplification. Therefore, the transmitter is preferably provided with a common amplifying system, in which the signals in all the channels are amplified together.

In a common amplifying system, however, a spurious signal produced by the inter-modulation of the signals of many channels due to the non-linearity of the amplifier presents a problem. The radio wave regulation of Japan specifies the upper limit of the strength of the spurious signal; 60 dB lower than the channel signal strength for a base station of the portable radio telephone system, and 70 dB lower for a base station of the radio paging system which has higher power. Usually, the strength of the spurious signal produced by common amplification in a high power transistor device is about 30 dB weaker than the signal strength. This is far from meeting the regulation, necessitating some measure to reduce the strength of the spurious signal an additional 30 to 40 dB. Thus, distortion cancellation by feedforward techniques has been adopted.

An explanation of a conventional signal suppression circuit, which constitutes a basic principle of the distortion cancellation by feedforward system, is provided below; and then the operation of a feedforward amplifier is described.

Figure 1:
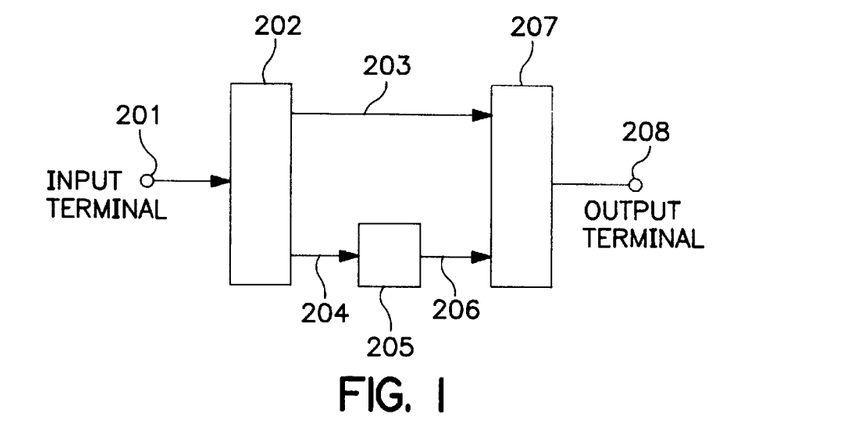
FIG. 1 Block diagram showing the principle of distortion suppression circuit.

FIG. 1 is a block diagram showing the basic constitution of a signal suppression circuit. A signal suppression circuit comprises an input terminal 201, a power divider 202 for dividing an inputted signal to a route 203 and a route 204, a phase inverter 205 connected with route 204 for outputting a signal with its phase inverted 180° to a route 206, a power combiner 207 for combining the signals from route 203 and route 206, and an output terminal 208.

The basic operation of the signal suppression circuit is as follows. A signal inputted at the input terminal 201 is divided to two parts by the power divider 202; to route 203 and route 204. A signal divided to route 204 is inverted 180° in its phase by the phase inverter 205 to be supplied to route 206. Signals from route 203 and route 206 are combined by the power combiner 207. There will be no output signal at the output terminal 208 because both the signals have the same magnitude but opposite phase and cancel each other out.

A feedforward amplifier cancels the distortion through a combination of two said signal suppression circuits.

Figure 2:
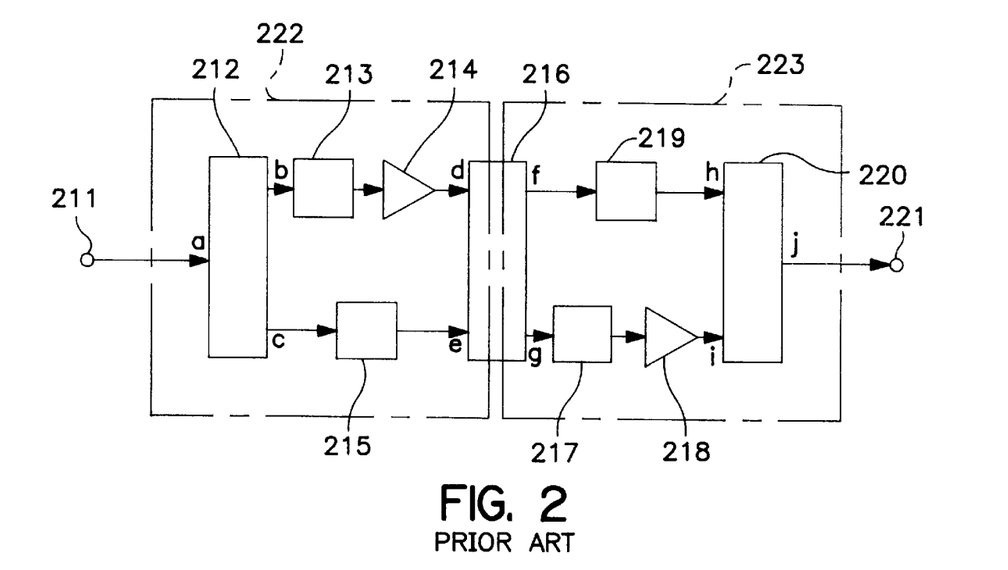
FIG. 2 Block diagram of a prior art feedforward amplifier.

FIG. 2 is a block diagram of an exemplary prior art feedforward amplifier. Referring to FIG. 2, a prior art feedforward amplifier comprises an input terminal 211; a first distortion detection circuit 222 which is comprised of a power divider 212, a vector adjuster 213, a main amplifier 214, a delay line 215, and a power combiner 216; a second distortion cancellation circuit 223 which is comprised of a power combiner 216, a vector adjuster 217, an auxiliary amplifier 218, a delay line 219, and a power combiner 220; and an output terminal 221.

In the first distortion detection circuit 222, the input signal to the input terminal 211 is delivered to the power divider 212 at port a, to be divided to port b and port c. The signal from port b goes through the vector adjuster 213 and is amplified by main amplifier 214 and inputted into the power combiner at port d. Another part of the signal is transmitted from port c to the power combiner 216 at port e through the delay line 215. The circuit is arranged so as to have the input signals at the port d and the port e cancel each other out. That is, the degree of combination between the ports d–g and the ports e–g of the power combiner 216 is arranged appropriately, and the amplitude and phase of the signal inputted at the port d are adjusted by the vector adjuster 213 so that signal at port g from port d and from port e have the same magnitude but opposite phases. If the adjustment is complete, no signal is outputted from the port g.

However, the signal outputted from the main amplifier 214 and inputted to the power combiner 216 at port d includes a distortion component, in addition to the amplified component of the multiple input signals. The distortion component is due to inter-modulation resulting from non-linearity of the main amplifier. The signal inputted at the port e has no distortion component. As a result, when the two signals are combined at the power combiner 216, normal input signal components are canceled, outputting only the distortion element from the port g. If the coupling between the ports d and f is approximately 1 and the coupling between the ports d and g is sufficiently low, then the majority of the normal input signal and the distortion component outputted by the main amplifier 214 are outputted at the port f.

In the distortion cancellation circuit 223, the signal outputted from port f of the power combiner 216 consisting of the input normal signal and the distorted component is inputted to port h of the power combiner 220 through the delay line 219. The distortion element outputting from the port g is transmitted to port I of the power combiner 220 via the vector adjuster 217 and the auxiliary amplifier 218. If the coupling between the ports h and j and between i and j of the power combiner 220 are appropriately set and the vector adjuster 217 is suitably adjusted, the distortion components inputted at the ports h and i have the same amplitude and opposite phases and thus cancel each other out. The combiner 220 outputs the normal input signal with minimal distortion. Also, if in the power combiner 220, the coupling between the ports h and j is approximately 1 and the coupling between the ports i and j is sufficiently low, the input signal element inputted into the port h is primarily outputted from the port j.

Thus, by optimally setting of the distortion detection circuit 222 and the distortion cancellation circuit 223, the inter-modulation distortion introduced by the main amplifier 214 is canceled.

However, in the above described feedforward amplifier, the cancellation of the distortion over a wide frequency range is difficult to realize. The reason why is described in the following.

It has been described that, in a signal suppression circuit as shown in FIG. 1, the signal suppression is conducted through combining of the two signals, which were divided at the power divider 202 and having the same magnitude but opposite phases, with the power combiner 207. In reality, however, it is difficult to realize such an ideal state over a wide frequency range.

In order to form the phase inverter circuit 205, a microstrip line of half the wave length at a targeted frequency may be used.

Figure 3:
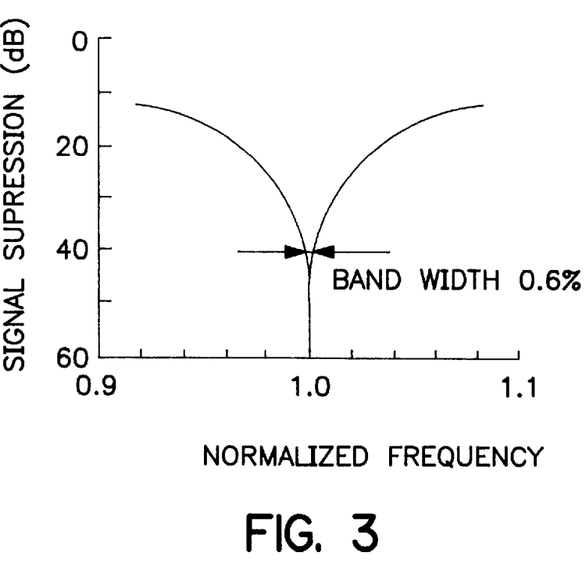
FIG. 3 Graph of the frequency characteristics of the distortion suppression circuit of FIG. 1.

The frequency characteristics of the signal suppression circuit are shown in FIG. 3, in which the ordinate shows the signal suppression and the abscissa indicates the frequency normalized by the center frequency. As shown in FIG. 3, the signal suppression or more than 60 dB is obtained at the center frequency. However, if the suppression of more than 40 dB is required, the band width is narrowed to only 0.6%.

To obtain phase inversion for a wide frequency range, various other methods are possible. Providing a directional combiner in the places of power divider and power combiner to obtain a 90° phase difference at each, results in a 180° phase difference as a whole. Other phase inversion method includes using a circulator short-circuited at one-terminal in the phase inversion circuit, which realizes a phase inversion through the total reflection at the short-circuited part. Practically, however, the phase inversion is difficult to obtain for a wide frequency range because of the frequency dependence, in spite of the frequency independence in principle. Moreover, the main amplifier and the auxiliary amplifier in the feedforward amplifier in FIG. 2 have gain and phase characteristics which are dependent on frequency, furthermore the characteristics shift with the temperature and the lapse of time. So the distortion cancellation over a wide frequency range is even more difficult.

By the reasons described above, it is quite difficult for a prior art feedforward amplifier as shown in FIG. 2 to realize a material distortion cancellation effect over a wide frequency range in a stable manner. In a prior art feedforward amplifier the characteristics are confined within a relatively narrow frequency range, consequently the distortion cancellation tends to be insufficient at a slight shift with one of the factors in the circuit. Therefore, in some cases, each circuit is monitored continuously or intermittently to have respective control points controlled for minimizing the output of distortion component, in order to avoid the insufficient cancellation and maintain each of the circuits always in optimum condition.

The present invention aims to solve the above described problems, and offer and apparatus and a method for controlling a feedforward amplifier with which a material distortion cancellation effect is maintained for a wide frequency range.

SUMMARY OF THE INVENTION

To attain the above object an apparatus according to the present invention for controlling feedforward amplifier comprises a first base frequency generating means consisting of one or two means; a second base frequency generating means; a pilot signal generator means for generating a first pilot signal having said first frequency and a second pilot signal having said second frequency based respectively on signals from said first base frequency generating means and second base frequency generating means; a pilot signal injecting means for injecting said first or second pilot signal to the output route of said main amplifier; a first signal extracting means for extracting a part of signal out of the output route of said first circuit; a second signal extracting means for extracting a part of signal out of the output route of said second circuit; a frequency converting means for outputting a first or a second low-range converted pilot signal by picking up said first pilot signal from said first signal extracting means and said second pilot signal from said second signal extracting means, and converting the frequency of said first or second pilot signal using the signal from said first base frequency generating means; a quadrature demodulating means for demodulating the first or second low-range converted pilot signal form said frequency converting means into the I and Q signal components using the signal from said second base frequency generating means; a monitor signal producing means for producing pilot monitor signal by amplifying and shaping the first or second low-range converted pilot signal from said frequency converting means; an A/D converting means for converting the I and Q signal components from said quadrature demodulating means into digital value; and a control means for maintaining the values of control signals that produce the smallest amplitude level with said pilot monitor signal, by receiving the digital value from said A/D converting means as an error input and the pilot monitor signal from said monitor signal producing means as a monitor input, thereby outputting a control signal for controlling said second and fourth vector adjusters so as to have the smallest amplitude level with said pilot monitor signal.

Likewise, a method according to the present invention for controlling feedforward amplifier maintains the control values of vector adjusters at a time when the smallest amplitude level is obtained with said pilot monitor signal, by generating a first and a second base frequencies, generating a first pilot signal of said first frequency and a second pilot signal of said second frequency based respectively on said first and second base frequencies, injecting said first or second pilot signal to the output route of said main amplifier, extracting a part of signal out of the output route respectively of said first and second circuits, converting said first pilot signal component extracted from the signal picked up out of the output route of said first circuit using said first base frequency into a low range, converting said second pilot signal component extracted from the signal picked up out of the output route of said second circuit using said first base frequency into a low range, quadrature-demodulating said low-range converted first or second pilot signal into I and Q signal components using said second base frequency, producing a pilot monitor signal by amplifying and shaping said low-range converted pilot signal, and controlling said second and fourth vector adjusters to have the smallest amplitude level with said pilot monitor signal using said I and Q signal components as the error signal.

It is preferred that said first and second frequencies are set at the vicinity but outside the signal range to be amplified, above or below. It is further preferred that said pilot signal producing means produces a frequency which is the sum or difference between the first and second base frequency generating means as first and second pilot signals. In a case when the sum frequency of first and second base frequency generating means is used as the pilot signal, the first base frequency generating means is preferably comprised of a frequency synthesizer.

EMBODIMENTS

Figure 4:
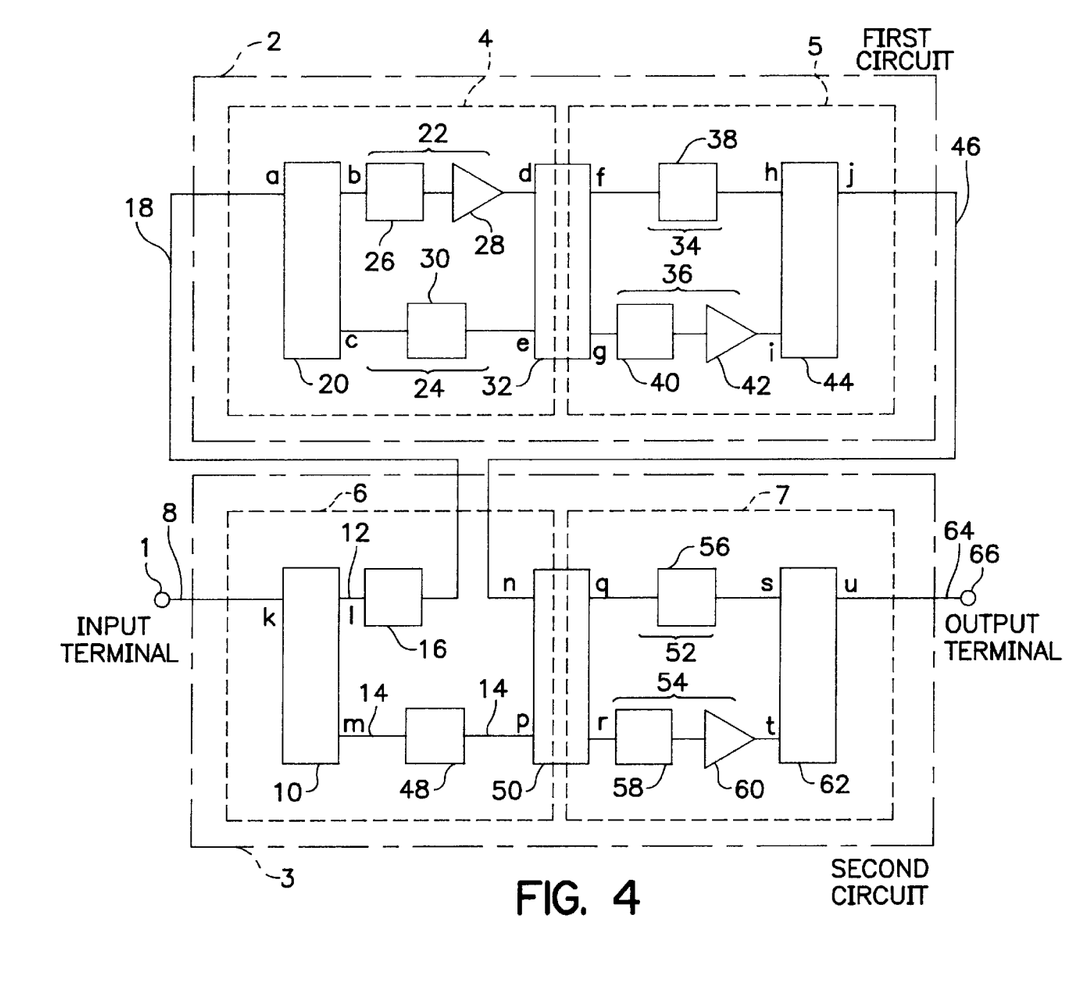
FIG. 4 Block diagram of a prior art double-circuit feedforward amplifier, to which the present invention is applied.

In the first place, description is made on a feedforward amplifier to which the present invention is applied, referring to FIG. 4. The power dividers and power combiners in prior art circuits (FIG. 1 and FIG. 2) have been replaced with a directional combiner in FIG. 4. The vector adjuster is comprised of an amplitude control and a phase control. The delay lines do not have phase inverting function as existed in prior arts, but they simply compensate the delay against the signal on a parallel line.

A feedforward amplifier shown in FIG. 4 consists of a first circuit (first feedforward circuit) and a second circuit (second feedforward circuit). The first circuit 2 comprises a first distortion detection circuit 4 and a first distortion cancellation circuit 5, and the second circuit 3 comprises a second distortion detection circuit 6 and a second distortion cancellation circuit 7.

The first distortion detection circuit 4 comprises a first directional combiner 20 for dividing a signal from the route 18 to route 22 and route 24, a first vector adjuster 26 and a main amplifier 28 disposed in series and the route 22, a first delay line 30 disposed in the route 24, and a second directional combiner 32 for combining the signals of route 22 and route 24.

The first distortion cancellation circuit 5 comprises a second directional combiner 32 for splitting a signal from the circuit 4 to route 34 and route 36, a second delay line 38 disposed in the route 34, a second vector adjuster 40 and a first auxiliary amplifier 42 disposed in series in the route 36, and a third directional combiner 44 for combining the signals of route 34 and route 36 to be outputted to route 46.

The second distortion detection circuit 6 comprises an input terminal 1 to which an input signal is entered, a fourth directional combiner 10 for splitting the signal from route 8 to route 12 and route 14, a third vector adjuster 16 disposed in the output route 12, a third delay line 48 disposed in the other output route 14, and a fifth directional combiner 50 for combining the signals of route 14 and route 46. The above described first circuit 2 is coupled between the output route 18 of third vector adjuster 16 and the route 46.

The second distortion cancellation circuit 7 comprises a fifth directional combiner 50 for splitting a signal from the circuit 6 to route 52 and route 54, a fourth delay line 56 disposed in the route 52, a fourth vector adjuster 58 and a second auxiliary amplifier 60 disposed in series in the route 54, and a sixth directional combiner 62 for combining the signals of route 52 and route 54 to be outputted to an output terminal 66 via route 64.

The feedforward amplifier of FIG. 4 operates as follows. When a signal including multi-channel components is inputted at the input terminal 1, it is divided by the fourth directional combiner 10 to two parts, route 12 and route 14. The signal divided to the route 12 goes through the third vector adjuster 16 and route 18 to the first directional combiner 20 at port a within the first distortion detection circuit 4, to be outputted at port b to route 22 and at port c to route 24. The signal from port b goes through the first vector adjuster 26 to the main amplifier 28 for amplification to be inputted to the second directional combiner 32 at port d. The signal from port c goes through the first delay line 30 disposed in the route 24 to the second directional combiner 32 at port e. When, the signals inputted at port d and port e are adjusted sot hat they cancel out each other and do not appear to port g. Namely, the coupling between the ports d and g and between the ports e and g of the second directional combiner 32 is appropriately set, and the amplitude and the phase of signal to be inputted to the port d are adjusted by the first vector adjuster 26 so as the inputs signal to the port d and to the port e can be combined at port g with the same amplitude but with 180° different phase angles, making the signal output from port g the smallest. Consequently, there will be no output signal from the port g, if the adjustment is complete.

However, due to non-linearity the main amplifier 28 generally has, the input multi-channel signals bring about distortion components resulted from inter-modulation, to be outputted besides input signal components. Namely, the input signal to port d contains distortion components in addition to input signal components. In the mean time, as the input signal to port e does not contain any distortion component, the input signal components are canceled to each other out when input signals from port d and port e are coupled together in the second directional combiner 32, and the port g outputs only distortion component. If the coupling between the ports d and f is approximately 1 and the coupling between the ports d and g is sufficiently low, then the majority of the normal input signal and the distortion component outputted by the main amplifier 28 are outputted at the port f.

In the first distortion cancellation circuit 5, the signal outputted from the port f of the second directional combiner 32 consisting of the input normal signal and the distorted component is inputted to the port h of the third directional combiner 44 through the route 34 containing delay line 38. The distortion element outputted from the port g is transmitted to the port i of the third directional combiner 44 via route 36 in which the second vector adjuster 40 and the first auxiliary amplifier 42 are contained in series. If the distortion components inputted at the ports h and i have the same amplitude and opposite phases at port j, then the distortion components cancel each other out and only the amplified normal input signal component is outputted from the port j. In order to implement this situation, the coupling between the ports h and j and between i and j of the third directional combiner 44 are appropriately set and the amplitude and phases of the signal to be inputted to the port i are adjusted by the second vector adjuster 40 so as the output of distortion component from the port j becomes the lowest. Also, if, in the third directional combiner 44, the coupling between the ports h and j is approximately 1 and the coupling of between the ports i and j is sufficiently low, the port j outputs only the normal signal components inputted to port h.

Thus, the distortion component introduced by the main amplifier 28 is canceled by the above described first circuit 2. However, as already described with respect to the prior art feedforward amplifier, a material distortion cancellation effect is available only within a limited frequency range in a case when the first circuit alone is employed. That is, the first circuit 2 may output a distortion component, on top of the normal input signal component. Consequently, a further distortion compensation has to be provided in order to obtain a sufficient amount of distortion suppression.

In a feedforward amplifier according to the present invention, a second circuit 3 is further provided assuming the above described first circuit 2 as a virtual main amplifier.

Referring to FIG. 4, the output from the port j of the third directional combiner 44 of the first circuit 2 is inputted to the port n of the fifth directional combiner 50 via route 46. The part of the signal divided by the fourth directional combiner and outputted through the port m is transferred to port p of the fifth directional combiner via route 14 in which the third delay line is contained. The input to the port n includes the normal signal and the remaining distortion elements which was not removed in the first circuit 2, while the input to the port p consists of the normal input signal only. By appropriately setting the coupling between the ports n and r and between the ports p and r of the fifth directional combiner 50, and adjusting the third vector adjuster 16, the inputs signal to the port n and port p can be added at the port r with the same amplitude but with 180° different phase angles to the smallest signal output. This results in the output at the port r of a signal consisting mainly of the distorted components inputted at port n, the normal signal element being weak. If the coupling between the ports n and q is approximately 1, and the coupling between the ports n and r is sufficiently low, the majority of the input to the port n will be outputted from the port q.

The output from the port r (mainly the distorted component) of the fifth directional combiner 50 is transferred to the port t of the sixth directional combiner 62 via the fourth vector adjuster 58 and the second auxiliary amplifier 60, where it is amplified, disposed in route 54. While the output from port q (the normal signal and the distortion component) is inputted to the port s of the sixth directional combiner 62 through the fourth delay line 56 in route 52. By appropriately setting the coupling between the ports s and u and between the ports t and u of the sixth directional combiner 62, and adjusting the fourth vector adjuster 58 disposed in route 54, the inputs signal to the port s and port t can be added at the port u with the same amplitude but with 180° different phase angles. This produces an output signal with the distortion components sufficiently canceled and suppressed, that is the normal signal amplified. If the coupling between the ports s and u is approximately 1 and the coupling between the ports t and u is made sufficiently low, the majority of the input to the port s will appear in the port u to be outputted from the output terminal 66 via route 64.

In the above, the operation of a feedforward amplifier comprising of a first circuit and a second circuit as shown in FIG. 4 has been described. In the following description, this kind of feedforward amplifier is referred to as double-circuit feedforward amplifier.

Figure 5:
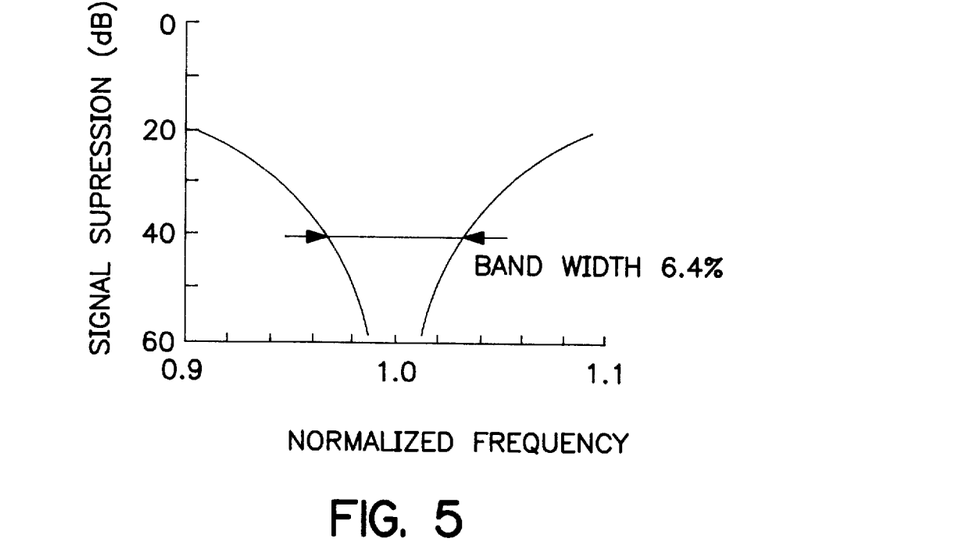
FIG. 5 Graph of the frequency characteristics of the distortion suppression circuit with the amplifier of FIG. 4.

The frequency range in which the distortion suppression is available depends on the frequency ranges of the first distortion cancellation circuit 5 and the second distortion cancellation circuit 7. The distortion cancellation of a whole feedforward amplifier is obtained as the multiplication of the distortion suppressions of said first distortion cancellation circuit and the second distortion cancellation circuit, so that the double-circuit feedforward amplifier as shown in FIG. 4 has a distortion cancellation characteristic (FIG. 5) over a frequency range wider than that shown in FIG. 3.

Figure 6:
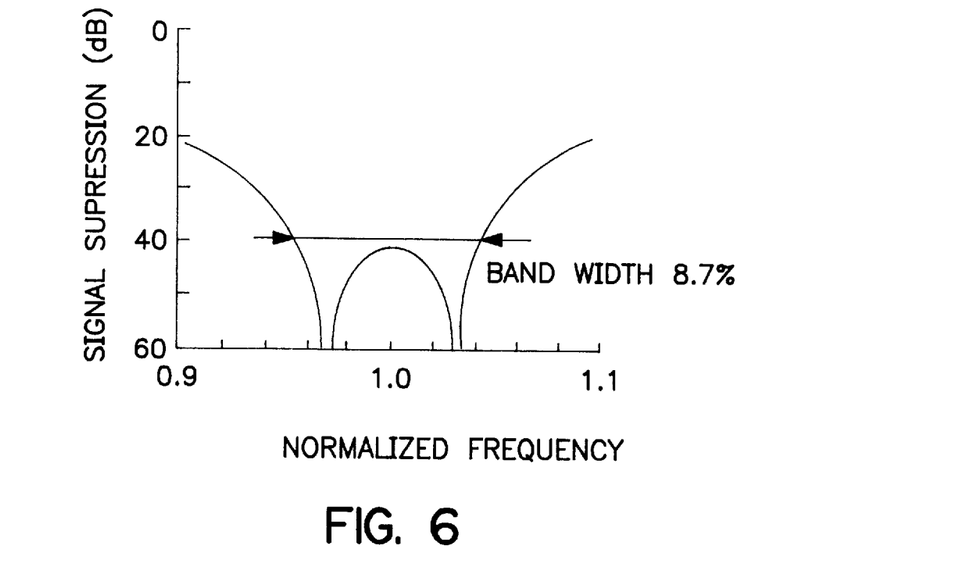
FIG. 6 Graph of the frequency characteristics of the distortion suppression circuit with a staggered double-circuit feedforward amplifier.

Distortion cancellation of a double-circuit feedforward amplifier shown in FIG. 4 over the wider frequency range can be further widened by shifting the center frequency of one circuit from that of the other circuit. Namely, in FIG. 4, by making the center of frequency, at which the distortion compensation action of the first circuit 2 is performed, different from the center of frequency, at which the distortion compensation action of the second circuit 3 is performed, the distortion cancellation is obtained over a further widened frequency range. FIG. 6 shows the distortion suppression frequency characteristics when the respective center frequencies of distortion suppression action in the first circuit and the second circuit are made to be ±3% to the center frequency of input signal. As compared with FIG. 5, it is seen that the frequency range has become wider. In the forthcoming description, this type of amplifier is referred to as staggered double-circuit feedforward amplifier. Normally the center frequencies of each of the circuits are set at both outsides, above and below, of the signal frequency range.

Thus, by having the center frequency, at which the distortion suppression action is performed, of each of the circuits shifted, a feedforward amplifier can cope with a wide frequency range for the amplification of a multi-channel signal having wide channel band. It also compensates for a main amplifier having inferior characteristics, where the distortion due to inter-modulation in common amplification includes not only the third harmonic but also fifth, seventh etc. requiring the distortion suppression frequency range to be much wider than the channel band.

The superior performance of a feedforward amplifier as described above can always be maintained and provide by a control apparatus and method according to the present invention which will be described hereunder. The control apparatus and method works to maintain the functioning of a feedforward amplifier at its best state, eliminating the fluctuation in equilibrium between the circuits resulted from the characteristics change of amplifier and other constituent components due to change of ambient temperature or weathering.

Figure 7:
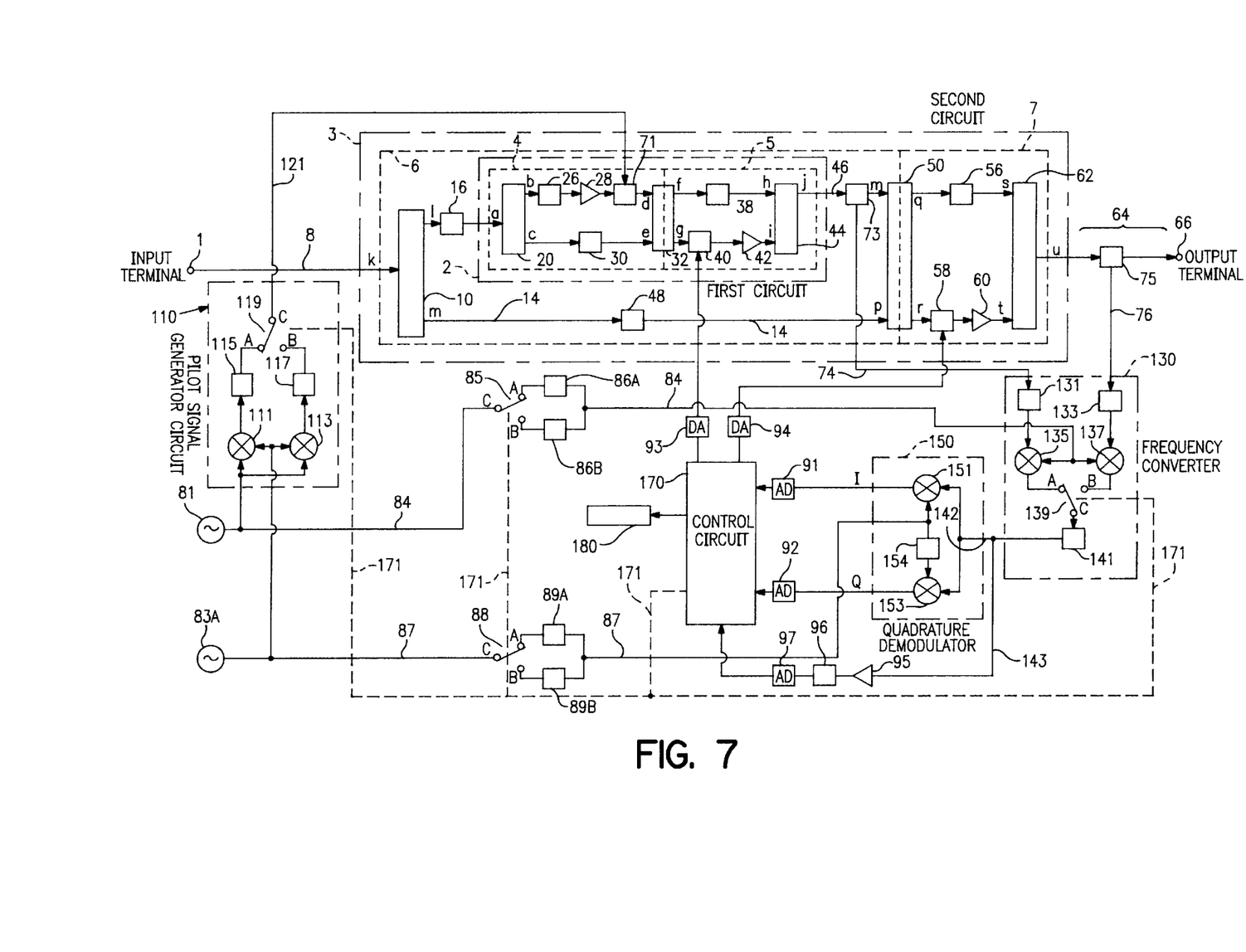
FIG. 7 Block diagram of a first embodiment of a staggered double-circuit feedforward amplifier comprising a control apparatus according to the present invention.

FIG. 7 is a block diagram showing a staggered double-circuit feedforward amplifier comprising a control apparatus according to a first embodiment of the present invention. In FIG. 7, those constituent elements having the same function as those of FIG. 4 are given with the same symbols, and explanation to which is omitted.

Referring to FIG. 7, the control apparatus comprises in the signal routes of a staggered double-circuit feedforward amplifier a pilot signal injector 71 disposed in a route from the output of main amplifier 28 to the port d of the second directional combiner 32, for injecting a pilot signal into the port d of directional combiner 32; a first signal extractor 73 disposed in a route between the port j of third directional combiner 44 and the port n of fifth directional combiner 50, for extracting a part of signal out of the route 46; and a second signal extractor 75 disposed in a route 64 guiding the output signal at port u of sixth directional combiner 62 to the output terminal 66, for extracting a part of signal out of the route 64.

A pilot signal to be injected to the amplifying route at pilot signal injector 71 is generated at a pilot signal generator circuit 110. Pilot signal generator circuit 110 comprises multipliers 111 and 113, narrow band pass filters 115 and 117, and a switch 119. The outputs of the first base frequency generator 81 having first base frequency and the second base frequency generator 83A having second base frequency are converted, by the multipliers 111 and 113 within the pilot signal generator circuit 110, to become source of the pilot signal.

A frequency converter 130 comprises narrow band pass filters 131 and 133, multipliers 135 and 137, a switch 139, and a narrow band pass filter 141. The signal picked up by the first signal extractor 73 from the amplification route is led to the narrow band pass filter 131, and the signal extracted by the second signal extractor 75 to the narrow band pass filter 133, to extract the pilot signal component, which were mixed at the multipliers 135 and 137 with the output of the first base frequency generator 81A having first base frequency, to be outputted as a low-range converted signal having differential frequency component.

A quadrature demodulator 150 is a circuit for obtaining the phase information on pilot signal extracted and low-range converted by the frequency converter 130. The quadrature demodulator 150 comprises multipliers 151 and 153, and a 90° phase shifter 154, and performs synchronous detection on the low-range converted pilot signal sent from the frequency converter 130 with the output of the second base frequency generator 83A having second base frequency to demodulate the I and Q signals. A/D converters 91 and 92 convert these I and Q signals into digital signals.

Delay line 86A/86B inserted in a route 84 connecting the first base frequency generator 81 to the frequency converter 130 is for compensating the delay of the pilot signal coming from the pilot signal generator circuit 110, via injector, feedforward amplifier, narrow band pass filter etc. to multiplier 135/137, against the first base frequency generator 81. The delay lines 89A and 89B inserted in a route 87 connecting the second base frequency generator 83A to the quadrature demodulator 150 is for compensating said delay plus a delay corresponding to the route between the multiplier 135/137 and multipliers 151 and 153.

A control circuit 170, which is comprised of e.g. microprocessor, receives the error data from A/D converters 91 and 92 and monitors the low-range converted pilot signal of output of the frequency converter 130 through amplifier 95, envelope detector 96, and A/D converter 97, and controls the second vector adjuster 40 and the fourth vector adjuster 58 through D/A converters 93 and 94 so as the low-range converted pilot signal becomes the smallest. When the smallest value of the extracted pilot signal is obtained, the control circuit 170 latches the control signals given to vector adjusters to have the state of the smallest pilot signal, that is, the state at which a feedforward amplifier is adjusted to its best condition, maintained.

A route 171 connecting the control circuit 170 with switches represents that each of the switches can be operated according to programs stored in a ROM housed in the control circuit 170.

D/A converters are disposed between the control circuit 170 and each of the vector adjusters because in the exemplary circuit of FIG. 7 the vector adjusters are controlled by analog signal. Therefore, the D/A converters are unnecessary where the adjusters are digitally controlled.

In the following, the control of a staggered double-circuit feedforward amplifier for a 800 MHz band base station of portable radio telephone system is described referring to FIG. 7. For the sake of explanation, the center of frequency with which the first distortion suppression circuit 5 works (hereinafter referred to as first frequency) is set at 809.3 MHz, that of the second distortion suppression circuit 7 (second frequency) at 830.7 MHz; and the frequency of the first base frequency generator 81 at the center frequency of the staggered double-circuit feedforward amplifier 820 MHz, the frequency of the second base frequency generator 83A and 10.7 MHz.

Switches 85, 88, 119, and 139 are turned to have contact with points A, according to an instruction sent from the control circuit 170 via the route 171, or by manual operation, for controlling the first distortion suppression circuit 5.

The outputs of the first base frequency generator 81 and the second base frequency generator 83A are multiplied by the multipliers 111 and 113 within the pilot signal generator circuit, and converted into frequencies of the sum and the difference, viz. (820±10.7) MHz. The narrow band pass filter 115 passes the differential frequency 809.3 MHz to the contact point A of switch 119, while the narrow band pass filter 117 passes the sum frequency 830.7 MHz to contact point B of the switch 119. As a common terminal C of the switch 119 is contacted with the contact point A, the pilot signal generator circuit 110 transmits via route 121 the first pilot signal of the first frequency 809.3 MHz to the output route of main amplifier 28 through the pilot signal injector 71. The signal containing the first pilot signal is extracted by the first signal extractor 73 disposed in the output route 46 of the first distortion suppression circuit 5 to be transmitted to the narrow band pass filter 131 within the frequency converter 130 via route 74. The filter 131, whose transmission frequency is 809.3 MHz, picks up only the first pilot signal component of the first frequency 809.3 MHz to be sent to the multiplier 135, which is then multiplied with the first base frequency 820 MHz sent from the first base frequency generator 81 through route 84, the output goes to the contact point A of switch 139, and to the narrow band filter 141 via common terminal C, and a first low-range converted pilot signal of the differential frequency component 10.7 MHz is extracted thereby. The signal, which shares the same characteristics as the first pilot signal extracted by the first signal extractor 73, is transmitted to the quadrature demodulator 150 via route 142, also to the control circuit 170 via route 143 containing amplifier 95, envelope detector 96 and A/D converter 97.

The quadrature demodulator 150 comprises multipliers 151 and 153 and a 90° phase shifter 154, and performs the synchronous detection of the first low-range converted pilot signal of 10.7 MHz arriving via route 142 with a delay-compensated signal arriving from the 10.7 MHz second base frequency generator 83A via route 87 containing a delay line 89A. Thus the I and the Q signals of the first low range converted pilot signal are demodulated. These I and Q signals are converted into digital signal by A/D converters 91 and 92 to be inputted to the control circuit 170 as the error signal.

The control circuit 170 receives the error data from the A/D converters 91 and 92, also monitors the amplitude level of the first low-range converted pilot signal arriving from the frequency converter 130 by the route 143 containing amplifier, detector, and A/D converter, and controls the second vector adjuster 40 through the D/A converter 93 so as the amplitude of low-range converted pilot signal becomes the smallest. The control is conducted through e.g. the method of perturbation.

According to the method of perturbation, the vector adjuster 40 is slightly shifted to see the resulting level of pilot signal extracted; if the level is found going smaller then further shifted in the same direction, if found going larger then shifted in the opposite direction, and the procedure is repeated.

When the smallest value of the low-range converted pilot signal is obtained, the control circuit 170 latches the digital control signal to the D/A converter 93 for maintaining the control state of the second vector adjuster 40, and then proceeds to the next step after storing the state in a built-in-memory.

The next step is adjusting of the second distortion suppression circuit 7. As soon as the adjusting/control of the first distortion detection circuit is confirmed completed, the control circuit 170 turns the switches 85, 88, 119 and 139 to the contact point B through the switch operating route 171. The switching may also be done by hand, in accordance with a display 180 coupled with the control circuit 170 for displaying the processing procedure.

From the pilot signal generator circuit 110, a second pilot signal of the second frequency 830.7 MHz , being the sum of the first base frequency and the second base frequency, passed through the narrow band pass filter 117, is injected to the first distortion suppression circuit 5 through the contact point B of switch 119, common terminal C, route 121, and the pilot signal injector 71. The second pilot signal of the second frequency is injected to the fifth directional combiner 50 at port n in the second distortion suppression circuit 7, through the first distortion suppression circuit 5 and route 46. A signal containing the second pilot signal is extracted by the second signal extractor 75 disposed in the output route of second distortion suppression circuit 7, or the amplifier output route 64, to be transmitted via route 76 to the narrow band pass filter 133 within the frequency converter 130. The filter 133, whose transmission frequency is 830.7 MHz, transmits only the second pilot signal component to the multiplier 137. The second pilot signal component is multiplied at the multiplier 137 with the first base frequency 820 MHz arriving from the first base frequency generator 81 via route 84, and the output of multiplier 137 goes to the 10.7 MHz narrow band pass filter 141 through contact point B and common terminal C of switch 139, and the second low-range converted pilot signal of 10.7 MHz, being the differential frequency, is picked up. The signal has the same characteristics as the second pilot signal extracted by the second signal extractor 75, and is transmitted to the quadrature demodulator 150 via route 142, also to the control circuit 170 via route 143 containing amplifier 95, envelope detector 96 and A/D converter 97.

The signal transmitted to quadrature demodulator 150 is, like the above described first low-range converted pilot signal when adjusting the first distortion suppression circuit, synchronous-detected by a delay-compensated signal received from the second base frequency generator 83A via route 87, and demodulated to the I and Q signals of the second low-range converted pilot signal. The A/D converters 91 and 92 convert these signals into digital signal to be inputted to the control circuit 170 and the I, Q error data.

The control circuit 170 receives the error data from the A/D converters 91 and 92, also monitors the amplitude level of the second low-range converted pilot signal arriving from the frequency converter 130 by the route 143 containing amplifier 95, envelope detector 96, and A/D converter 97, and adjusts the fourth vector adjuster 58 within the second distortion suppression circuit 7 through the D/A converter 94 so as the amplitude of the second low-range converted pilot signal becomes the smallest. When the smallest value of the second low-range converted pilot signal is obtained, the control circuit 170 latches the digital control signal to the D/A converter 94 for maintaining the control state of the fourth vector adjuster 58, and then stores the state in a built-in memory. Thus, the second distortion suppression circuit 7 is adjusted completing the adjusting/control of a staggered double-circuit feedforward amplifier.

In the present embodiment where the output of second base frequency generator 83A employed to produce pilot signal is applied to the quadrature demodulator 150 after compensating the delay corresponding to the transfer route of pilot signal, and the pilot signal extracted from the amplifier and low-range converted by the frequency converter 130 is precisely demodulated into vector quantity, or I and Q signals, the amplitude and phases of the vector adjusters 40 and 58 within the distortion suppression circuit are precisely adjusted. Therefore, the present embodiment has an advantage in that the equilibrium in each distortion suppression circuit can be quickly adjusted to an optimum state.

It is also possible to perform the control using only the envelope detection, without using the error signals I and Q. By the eliminated operation work, the detection of pilot signal level using the output of envelope detection is performed speedily. In this case of using only the envelope detection, however, the narrow band pass filter 141 is required to have a sufficiently high off-band attenuation characteristic.

Figure 8:
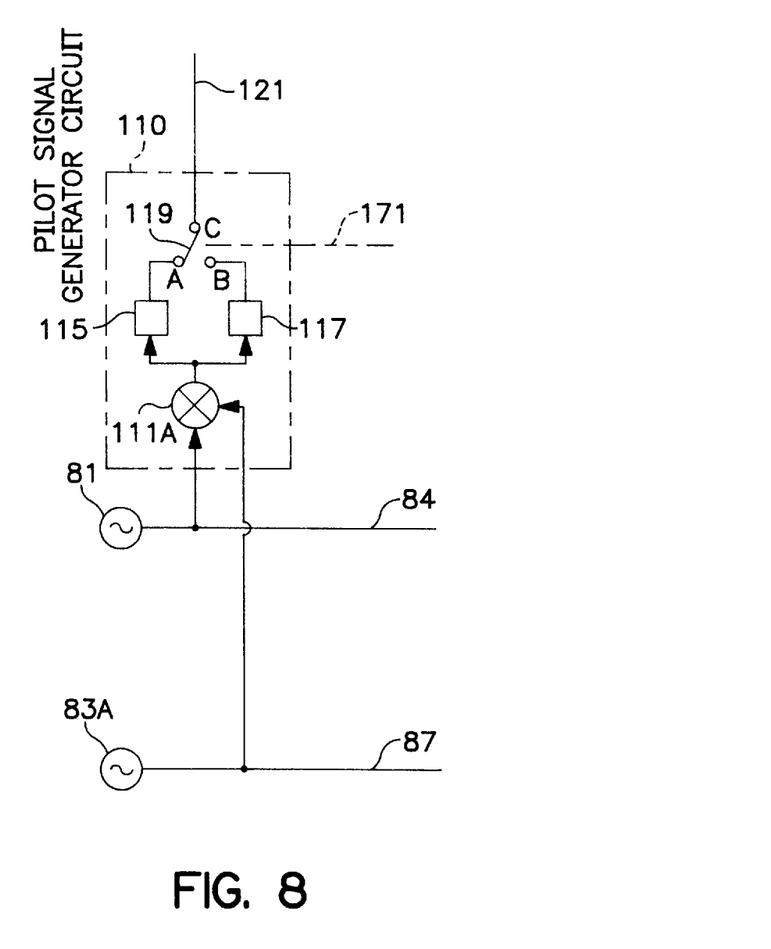
FIG. 8 Block diagram showing other constitution of the pilot signal producing circuit of FIG. 7.

The pilot signal generator circuit 110 in FIG. 7 comprises two multipliers 111 and 113, however, the circuit may be constituted with a single multiplier 111A as shown in FIG. 8. Further, when constituting the pilot signal generator circuit 110 with discrete components, the circuit may be simplified by the use of equilibrium modulator in place of the multiplier.

As the transmission frequency of the narrow band pass filter 141 in the frequency converter 130 is as low as 10.7 MHz, a ceramic filter is usually employed.

As already know publicly, the vector adjuster can easily be constituted with PIN diode which does not reveal rectifying function but acts simply as a resistive substance in high frequency range due to slow response of the carrier, or with varactor diode which works as a variable capacitance against the reverse directional voltage.

Figure 9:
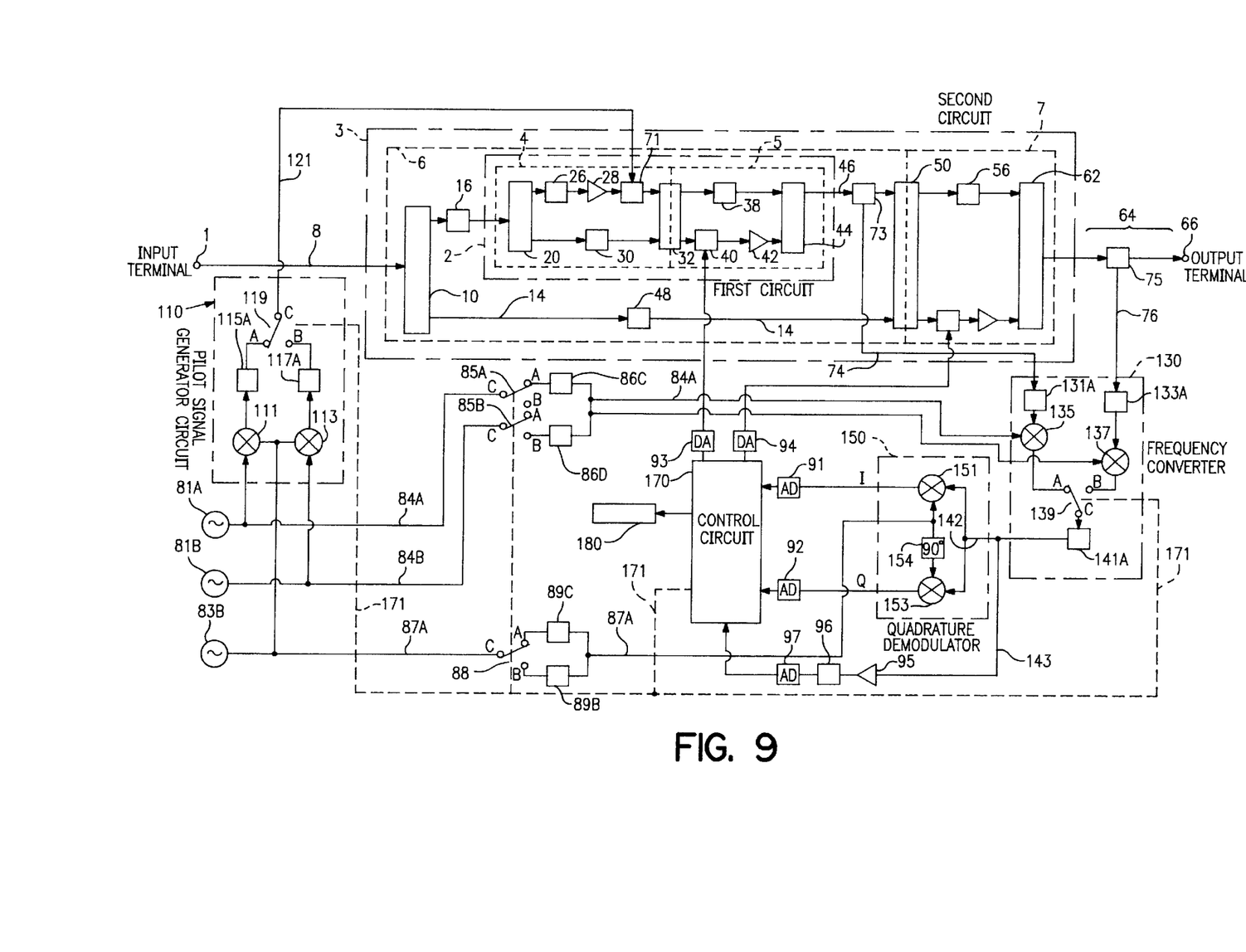
FIG. 9 Block diagram of a second embodiment of a staggered double-circuit feedforward amplifier comprising a control apparatus according to the present invention.

As a second embodiment, a more accurate detection of pilot signal, hence the precise equilibrium control of a staggered double-circuit feedforward amplifier according to the present invention is implemented by using a circuit as shown in FIG. 9.

For the sake of explanation, the central frequency of the operation of the first distortion suppression circuit 5, or the first frequency, is set out be 810 MHz, and the central frequency of the operation of the second distortion suppression circuit 7 to be 830 MHz. Therefore, the frequency of first pilot signal is 810 MHz, and that of the second pilot signal is 830 MHz.

These pilot signals are obtained by splitting the first base frequency generator 81 of FIG. 7 into two generators 81A and 81B, each generating 720 MHz and 740 MHz respectively, multiplying these frequencies with the frequency of second base frequency generator 83B, 90 MHz, at the multiplier 111/113 of pilot signal generator circuit 110, and filtering the sum frequency through the narrow band pass filter 115A/117A. These pilot signals are like the case of FIG. 7, injected to the amplifier through the pilot signal injector 71, and separated from the amplifying route by the signal extractors 73 and 75 to be transmitted to the frequency converter 130. The signals passing through the narrow band pass filters 131A/133A arriving at the multipliers 135/137 are multiplied with signals from 81A/81B, both being the first base frequency generator, and the output product therefrom is transmitted to narrow band pass filter 141A via switch 139. As the filter 141A has a transmission frequency 90 MHz a differential frequency is picked up. Delay lines 86C/86D, each inserted in routes 84A/84B respectively connecting the first base frequency generators 81A/81B to the multipliers 135/137, are for compensating the delay caused by the amplifying routes in which the pilot signals run through.

The pilot signal component which is low-range converted to 90 MHz is synchronous-detected at the quadrature demodulator 150 by a signal outputted from the second base frequency generator 83B and compensated with respect to the delay by delay line 89C/89D, and I and Q error signals are demodulated. The operating principle of the control circuit 170 controlling the amplifier based on the error signal remains the same as that described in the first embodiment of FIG. 7.

The second embodiment of FIG. 9 became more complicated than the first embodiment of FIG. 7 for the increased number of base frequency generators. However, the former has a feature in that the frequency of narrow band pass filter 141A within frequency converter 130 is 90 MHz, instead of 10.7 MHz in 141 of FIG. 7. The ceramic filters suitable to the 10.7 MHz are not quite satisfactory in their Q value, as well as in the stability against the temperature shift and weathering. These are the sensitive factors that affect the accuracy of adjusting/control according to the present invention. In the 90 MHz range, crystal filters are available, whose excellence in the high Q value and stability in the temperature variation and weathering contribute to further increase the accuracy and reliability of a control apparatus of the present invention.

Figure 10:
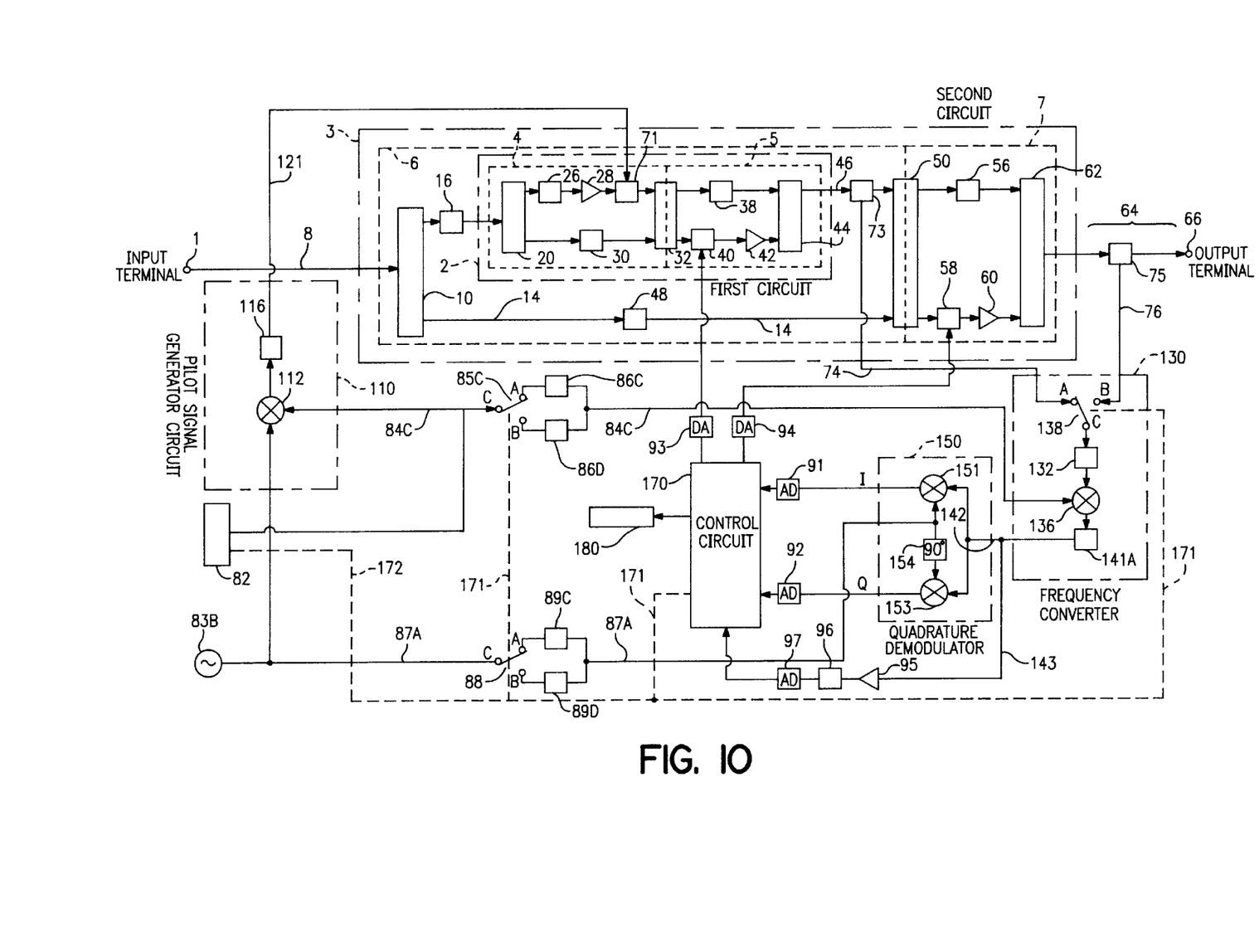
FIG. 10 Block diagram of a third embodiment of a staggered double-circuit feedforward amplifier comprising a control apparatus according to the present invention.

It is possible to simplify the second embodiment of FIG. 9 into a third embodiment as shown in FIG. 10. In FIG. 10, the first base frequency generator has been replaced with a frequency synthesizer 82. Its frequency, 720 MHz or 740 MHz, is switched by the control circuit 170 through the control route 172. As already known publicly, such a synthesizer is readily constituted by a combination of base oscillator, frequency multiplier, frequency divider, PLL circuit containing variable frequency oscillator etc.

The output of frequency synthesizer 182 is mixed at the multiplier 112 within pilot signal generator circuit 110 with the 90 MHz signal from the second base frequency generator 83B, and goes through a 810–840 MHz band pass filter and reaches at the pilot signal injector 71 via route 121.

Also, the output of frequency synthesizer 82 is transmitted to the frequency converter 130 after being delay-compensated by the delay line 86C/86D in route 84C, to convert at the multiplier 136 the frequency of a signal containing the pilot signal came from the signal extractor 73/75 via switch 138 and a 820 MHz band pass filter 132. The narrow band crystal filter 141A that passes the 90 MHz picks up the low-range converted pilot signal; the control operation thenceforth remains the same as in the second embodiment of FIG. 9.

In each of the above described embodiments, as the frequency of pilot signal is set at both outsides of signal band, above and underneath, the pilot signal is detected with a high precision and the equilibrium of the distortion suppression circuit within an amplifier is adjusted and controlled at a high accuracy. The same control may be conducted on the distortion detection circuit for obtaining a further improved distortion suppression characteristic. However, the quantity of suppression required in the distortion detection circuit is small; therefore, the distortion detection circuit may be adjusted once at the beginning, and in practice there is no need of further adjusting.

The first frequency is not limited to be a frequency lower than the second frequency. The frequencies quoted in the descriptions are of exemplary nature, not limiting.

In the present embodiment, the low-range converted pilot signal from the frequency converter 130 has been monitored through the route 143 containing the amplification, detection, A/D conversion, for obtaining the smallest value. The smallest value is obtainable also through monitoring the I, Q error data from the A/D converters 91 and 92.

Namely, as the square sum of I and Q signals is identical to the level of pilot signal detected, monitor signal may also be produced using this. In this case, the amplifier 95, envelope detector 96, and A/D converter 97 in route 143 may be eliminated.

In the present embodiment, the pilot signal has been injected to the output route of main amplifier; however, it is also possible to inject pilot signal to the input route of main amplifier.

As described above, the control apparatus and control method according to the present invention adjusts each of the distortion suppression circuits constituting an amplifier to an optimum equilibrium and maintains the equilibrium. Consequently, the influence on distortion compensation characteristics due to temperature variation and weathering of amplifying elements and other circuit elements is well suppressed, assuring a sustaining distortion cancellation effect over a wide frequency range.

The present invention can be embodied in various forms, without departing from the spirit or the main feature. The aforedescribed embodiments are only examples are not to be understood limitedly. The scope of the present invention is shown by the claims, and not be restricted by the above explanation. Modification or changes in the scope of the claims or equivalents thereto are all within the scope of the invention.

What is claimed:

1. An apparatus for controlling a feedforward amplifier having a first circuit and a second circuit; said first circuit having a main amplifier and a first and a second vector adjuster and operates at a first frequency; said second circuit having a signal input terminal and a third and a fourth vector adjuster and operates at a second frequency, comprising:

pilot signal generating means for generating a first pilot signal of said first frequency and a second pilot signal of said second frequency, injection means for injecting one of said first and second pilot signal into the output of said main amplifier, extraction means for sampling an output signal of said first circuit, frequency conversion means for extracting said first pilot signal from said extraction means and for producing a first low-range converted pilot signal, quadrature demodulation means for demodulating the first low-range converted pilot signal into I and Q signal components, monitor signal producing means for producing a pilot monitor signal, and control means for receiving the I and Q signal from said quadrature demodulation means and the pilot monitor signal from said monitor signal producing means, and producing a plurality of control signals for adjusting said second and fourth vector adjusters so as to maintain a minimal amplitude level of said pilot monitor signals.

2. The feedforward amplifier control apparatus of claim 1, in which there is provided base frequency generating means for adjusting the first and second frequencies, for changing the center frequency of operation of the first and second circuits respectively, above or below the signal range of the feedforward amplifier.

3. The feedforward amplifier control apparatus of claim 2, further comprising second extraction means for sampling an output signal from said second circuit and in which said base frequency generating means comprises:

at least one first base frequency generating means for generating a first base frequency, and a second base frequency generating means for generating a second base frequency.

4. The feedforward amplifier control apparatus of claim 3, comprising a pilot signal generation means for generating the first and second pilot signals by the sum and the differential frequencies of the outputs from the first and second base frequency generating means.

5. The feedforward amplifier control apparatus of claim 3, comprising a pilot signal generation means for generating the first and second pilot signals by the sum frequency of the outputs from the first and second base frequency generating means.

6. The feedforward amplifier control apparatus of claim 3, wherein the first base frequency generating means comprises a frequency synthesizer with which a plurality of different frequencies are available by switching.

7. The feedforward amplifier control apparatus of claim 2, further comprising:

frequency conversion means for extracting said second pilot signal from said second extraction means for producing a second low-range converted pilot signal;

monitor signal producing means for producing said pilot monitor signal by amplifying and shaping one of the first and second low-range converted pilot signal from said frequency conversion means; and, quadrature demodulation means for demodulating one of said first or second low-range converted pilot signal into said I and Q signal components.

8. The feedforward amplifier control apparatus of claim 7, wherein:

first and second low-range converted pilot signals are generated by converting the frequency of one of said first and second pilot signal in accordance with the signal from said first base frequency generating means; and said quadrature demodulation means for demodulating one of said first and second low-range converted pilot signal into I and Q signal components in accordance with the signal from said second base frequency generating means.

9. A method for controlling a feedforward amplifier having a first circuit and a second circuit; the first circuit having a main amplifier and a first and a second vector adjuster and operates at a first frequency; the second circuit having a signal input terminal and a third and a fourth vector adjuster and operates at a second frequency, comprising the steps of:

generating a base frequency, generating a first pilot signal of said first frequency and a second pilot signal of said second frequency, injecting the first or second pilot signal into the output of the main amplifier, sampling the output signal of the first circuit, extracting the first pilot signal component from the signal sampled from the output of the first circuit, low-range converting the extracted first pilot signal using the base frequency, quadrature-demodulating the low-range converted first pilot signal into the I and Q signal components using said base frequency, producing a pilot monitor signal by amplifying and shaping the low-range modulated pilot signal, adjusting the second and fourth vector adjuster so that the amplitude level of said pilot monitor signal is minimized by using the I and Q signal components as the error signal, and maintaining the control value of the second and fourth vector adjuster at which a minimum amplitude level of the pilot monitor signal is achieved.

10. The feedforward amplifier control method of claim 9, further comprising the step of generating at least one first base frequency and a second base frequency.

11. The feedforward amplifier control method of claim 10, further comprising the steps of:

sampling the output signal of the second circuit, extracting the second pilot signal component from the signal sampled from the output of the second circuit, low range converting the extracted second pilot signal using the first base frequency, quadrature-demodulating the low-range converted first or second pilot signal respectively into the I and Q signal components using said second base frequency, and producing the pilot monitor signal from at least one of the first low-range converted pilot signal and the second low-range pilot converted signal.

12. The feedforward amplifier control method of claim 9, further comprising the step of setting the first and second frequencies, corresponding to the center of operation of the first and second circuits respectively, above or below the signal range of the feedforward amplifier by adjusting said base frequency generating means.

13. The feedforward amplifier control method of claim 9, further comprising the steps of generating one of the first and the second pilot signal by one of summing and subtracting the first and second base frequencies.

14. The feedforward amplifier control method of claim 9, further comprising the step of generating the first or the second pilot signal by summing the first and the second base frequencies.

15. The feedforward amplifier control method of claim 9, further comprising the step of synthesizing the first base frequency with a frequency synthesizer.

* * * * *

UNITED STATES PATENT AND TRADE MARK OFFICE
CERTIFICATE OF CORRECTION

PATENT NO. : 5,815,036
DATED : September 29, 1998
INVENTOR(S) : Yoshikawa et al.

It is certified that error appears in the above-identified patent and that said Letters Patent is hereby corrected as shown below:

Column 15, line 34, delete "2" and insert --3--.

Signed and Sealed this

Thirtieth Day of March, 1999

Attest:

Q. TODD DICKINSON

*Attesting Officer*　　　*Acting Commissioner of Patents and Trademarks*